(12) United States Patent
Chokhawala et al.

(10) Patent No.: US 7,145,486 B1
(45) Date of Patent: Dec. 5, 2006

(54) CIRCUITS AND METHODS FOR EXCHANGING DATA THROUGH A SERIAL PORT AND SYSTEMS USING THE SAME

(75) Inventors: Amiya Anand Chokhawala, Austin, TX (US); Kartik Nanda, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/089,112

(22) Filed: Mar. 24, 2005

(51) Int. Cl.
*H03M 9/00* (2006.01)

(52) U.S. Cl. .......................... 341/100; 341/50; 710/30

(58) Field of Classification Search ........ 341/100–110, 341/50–60; 370/386, 389; 375/240.12; 710/14–30

See application file for complete search history.

(56) References Cited

U.S. PATENT DOCUMENTS

| | | | | |
|---|---|---|---|---|
| 5,553,220 A | * | 9/1996 | Keene | 345/520 |
| 6,167,466 A | * | 12/2000 | Nguyen et al. | 710/30 |
| 6,609,163 B1 | * | 8/2003 | Nguyen et al. | 710/21 |

\* cited by examiner

*Primary Examiner*—Lam T. Mai
(74) *Attorney, Agent, or Firm*—James J. Murphy; Thompson & Knight LLP

(57) ABSTRACT

A method of exchanging data through a serial port includes transmitting data as an output stream of frames defined by edges of a frame clock signal, a first data bit of a current frame transmitted during a time period starting in a preceding frame and extending after an edge of the frame clock signal defining the start of the current frame.

20 Claims, 3 Drawing Sheets

CIRCUITS AND METHODS FOR EXCHANGING DATA THROUGH A SERIAL PORT AND SYSTEMS USING THE SAME

FIELD OF INVENTION

The present invention relates in general to data processing techniques, and in particular, to circuits and methods for exchanging data through a serial port, and systems using the same.

BACKGROUND OF INVENTION

Many audio applications, such as audio analog to digital converters (ADCs) and audio encoder—decoders (CODECs), utilize a serial data port to transmit digitized audio data to other devices in a system. A typical audio serial data output port outputs bits of a serial audio data (SDOUT) stream in response to an associated serial clock (SCLK) signal. In a stereo system, two channels of audio data are time-multiplexed onto the SDOUT stream with a left-right clock (LRCK) signal. Overall timing is controlled by a master clock (MCLK) signal. At the integrated circuit level, the utilization of a serial port advantageously minimizes the number of pins and associated on-chip driver circuitry.

A typical serial data port operates in either a master mode or a slave mode. In the master mode, the SCLK and LRCK clock signals are generated internally, in response to a received MCLK signal, and output to the destination of the SDOUT stream. In the slave (asynchronous) mode, the SCLK and LRCK clock signals are received from the destination of the SDOUT stream, and therefore may have arbitrary phase relationships with the SDOUT stream.

In an ADC, the analog input signal is typically sampled on corresponding rising edges of an internal MCLK clock signal, while data are output on the falling edges of the SCLK signal. One frequent problem experienced with ADC serial output ports is the coupling of digital noise into the device substrate from the serial output driver at the SDOUT output, especially when the SDOUT output is driving a relatively high load. For example, if a bit of the SDOUT stream is output on a falling edge of the SCLK clock signal occurring slightly before the next sample of the analog input is sampled on the next rising edge of the MCLK signal, digital noise will couple into the ADC analog circuitry through the chip substrate and/or metal lines.

In the past, the problem of substrate noise generated by the SDOUT output driver has been addressed by re-timing the SCLK clock signal relative to the MCLK clock signal, such that the SDOUT output switching and analog input sampling operations are separated sufficiently in time to prevent digital noise in the substrate from being captured by the analog circuitry. However, in the slave mode, in which the SCLK signal is typically received with an arbitrary phase relationship with the external and/or internal MCLK signals, re-timing is difficult.

The problem of noise management is compounded when the LRCK signal is taken into account. At the edges of the LRCK signal, the serial port switches between data channels, which can generate substrate noise dependent on the LRCK signal as the output driver switches, depending on the state of the two channels at the switching event. At the same time, the first bit of the next channel must be available for a sufficient time period between the controlling edge of the LRCK signal and the next falling edge of the SCLK clock signal, which clocks out the second bit, such that the receiving device or system has sufficient time to capture that first bit.

Given the prevalence of serial ports in many data processing applications, and the general need to minimize noise within individual devices and systems, new noise management techniques suitable for serial port applications are desirable. In particular, these techniques should minimize noise occurring at transitions of a frame clock, such as the LRCK signal commonly used in audio applications. In addition to minimizing noise, such techniques should ensure that the first bit transmitted after switching frames is valid for a sufficient time for a receiving device or system to capture.

SUMMARY OF INVENTION

The principles of the present invention ensure that switching between frames of serial data in a serial data system is independent of the edges of the corresponding frame clock. According to one particular embodiment, a method is disclosed for exchanging data through a serial port which includes transmitting data as an output stream of frames defined by edges of a frame clock signal, a first data bit of a current frame transmitted during a time period starting in a preceding frame and extending after an edge of the frame clock signal defining the start of the current frame.

Embodiments of the present principles are suitable, for example, in serial audio systems in which multiple channels of audio data are time-multiplexed through a single port in response to a frame clock signal, such as an LRCK signal. By insuring that the first bit of data for the next channel is available prior to the edge of the frame clock signal implementing the switch between channels, noise at that frame clock signal edge is minimized. Further, additional time is provided between the frame clock signal edge and the following bit clock signal edge, which clocks out the next bit of data, thereby providing additional time for the receiving device or system to capture the first bit of the new channel.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
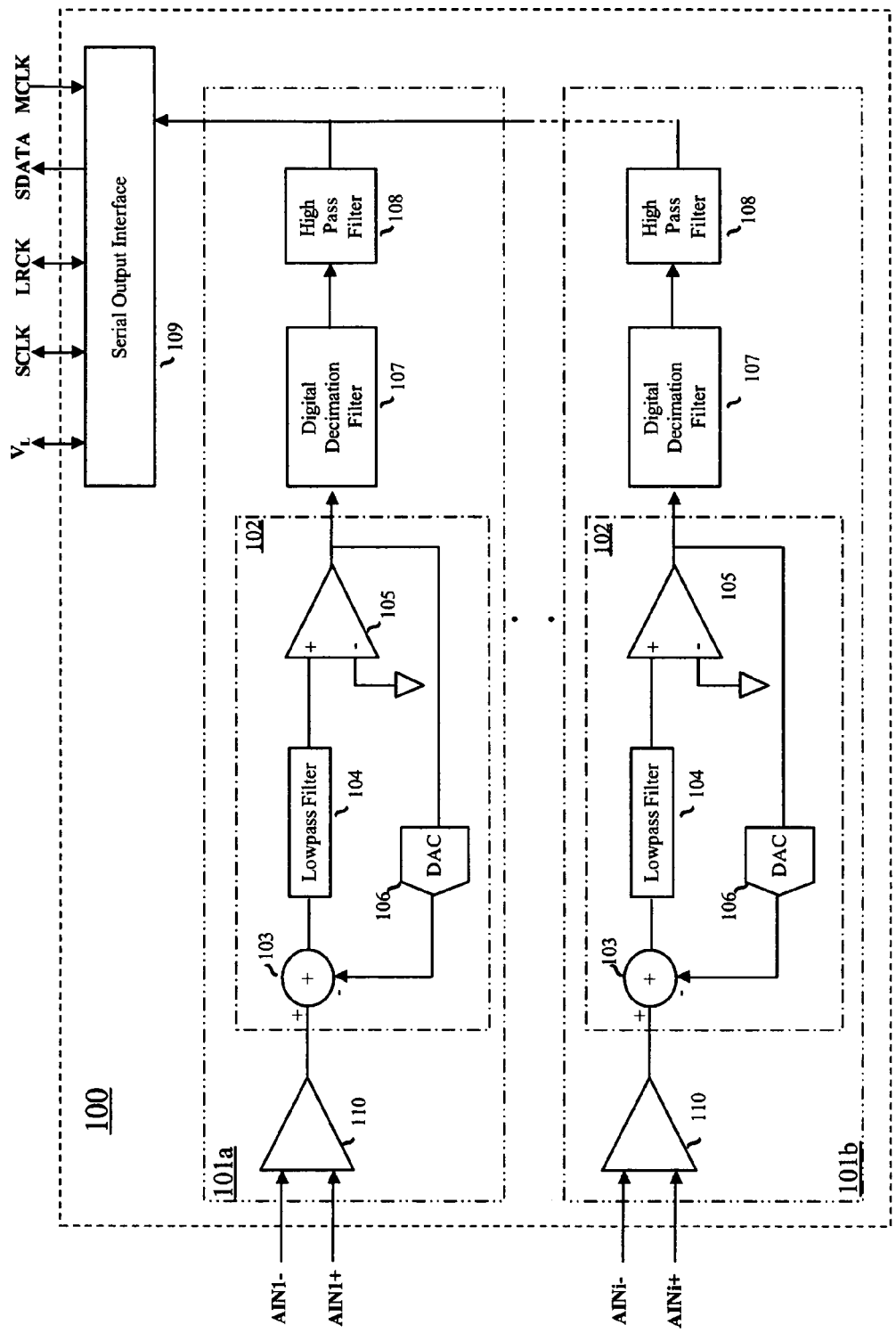
FIG. 1 is a high level block diagram of an exemplary audio analog to digital converter (ADC) suitable for describing one application of the principles of the present invention.
Figure 2:
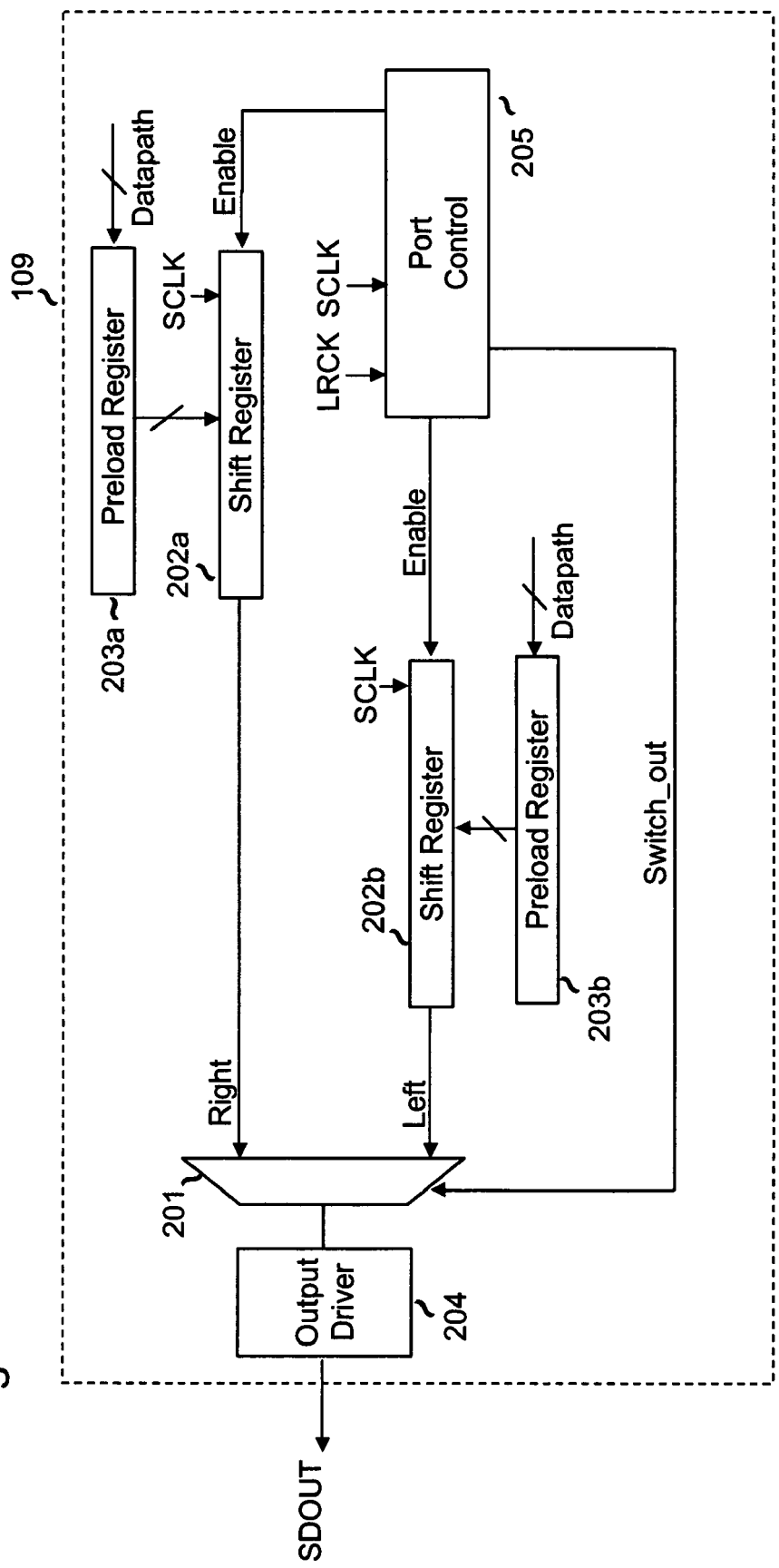
FIG. 2 is a more detailed block diagram of the serial interface circuitry depicted in FIG. 1.
Figure 3:
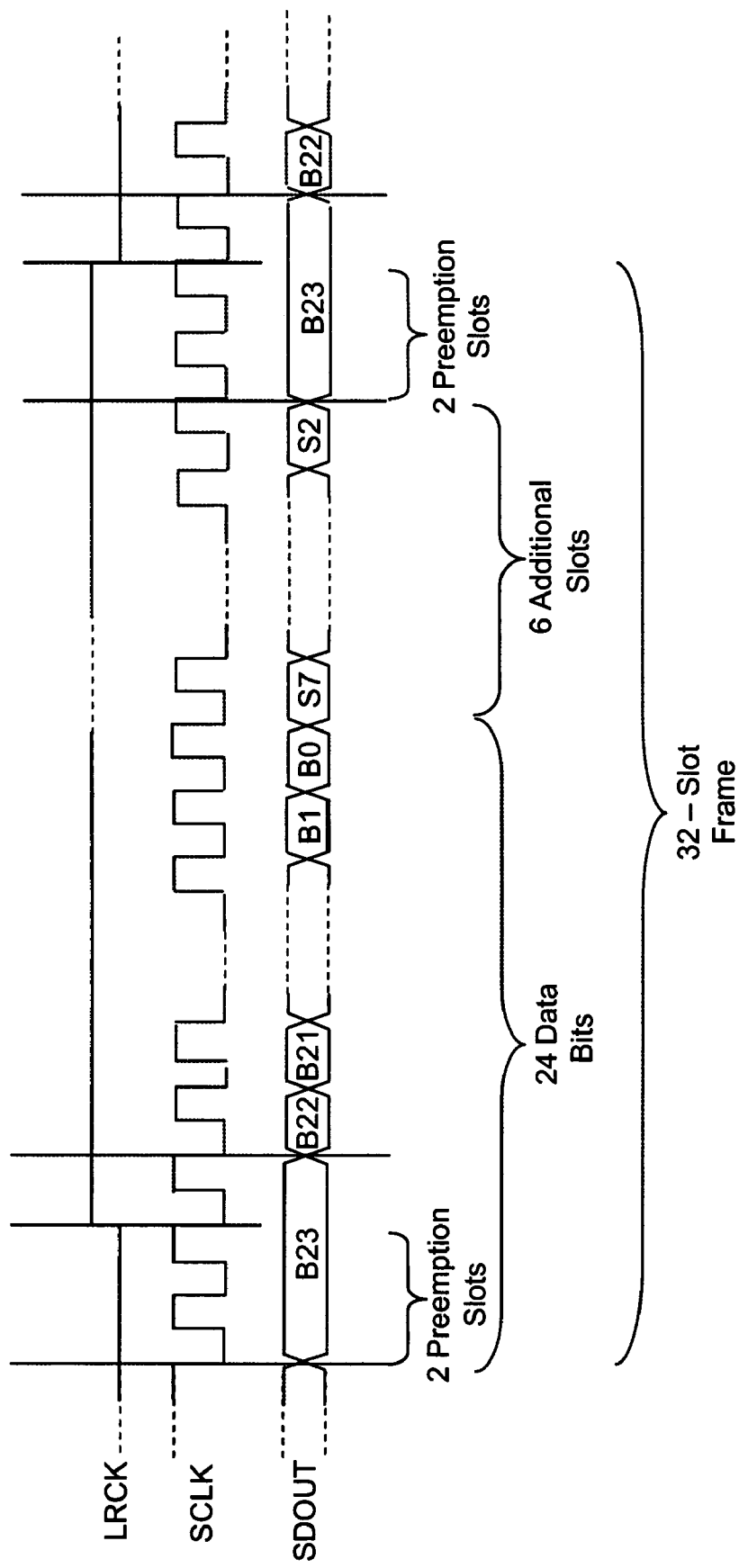
FIG. 3 is a timing diagram of exemplary serial data exchanges through the serial interface circuitry of FIG. 2 according to a representative embodiment of the principles of the present invention.

The principles of the present invention and their advantages are best understood by referring to the illustrated embodiment depicted in FIGS. 1–3 of the drawings, in which like numbers designate like parts.

FIG. 1 is a high level operational block diagram of a single-chip audio analog-to-digital converter (ADC) 100 suitable for describing the principles of the present invention. ADC 100 is only one of a number of possible applications in which the principles can advantageously be utilized; other examples include general purpose ADCs, digital to analog converters (DACs), and encoder-decoders (Codecs).

ADC 100 includes n-number of conversion paths, of which paths 101a and 101b are shown for reference, for converting n-number of channels of analog audio data respectively received at left and right analog differential inputs AlNi+/−, where i is the channel number from 1 to n. The analog inputs for each channel in the illustrated embodiment are passed through an input gain stage 110 and then to a delta-sigma modulator 102.

Each delta-sigma modulator 102 is represented in FIG. 1A by a summer 102, low-pass filter 104, comparator (quantizer) 105 and a DAC 106 in the feedback loop. The outputs of each delta-sigma modulator 102 is passed through a digital decimation filter 107, which reduces the sample rate, and a high pass filter 108.

The resulting digital audio data are output through a single serial port SDOUT of serial output interface 109, timed with a serial clock (SCLK) signal and a left-right clock (LRCK) signal. In the slave mode, the SCLK and LRCK signals are generated externally and input to ADC 100. In the master mode, the SCLK and LRCK signals are generated on-chip, along with the associated data, in response to a received master clock MCLK.

FIG. 2 is a conceptual block diagram illustrating the SDOUT output port circuitry of serial interface 109 of FIG. 1. In the exemplary two-channel embodiment of FIG. 2, one of the time-multiplexed left and right channels of stereo audio serial data is switched to the output of a multiplexer 201 in response to the control signal SWITCH_OUT, discussed further below. The bits of each sample of right channel audio data, along with any additional trailing bits within the corresponding frame, are shifted to the SDOUT output from a shift register 202a in response to falling edges of the SCLK clock signal, when enabled by the control signal ENABLE. Similarly, the bits of each sample of left channel audio data, and each trailing bit, if any, are shifted by the SCLK signal from a shift register 202b, as enabled by the ENABLE signal. Audio samples are loaded into shift registers 202a and 202b in parallel from corresponding preload registers 203a and 203b. An output driver 204 drives the SDOUT output.

According to the principles of the present invention, serial output interface 109 includes port management circuitry 205, which generates the control signals SWITCH_OUT and ENABLE. In general, port control circuitry 205 ensures that the output SDOUT is already set to the logic value of the first bit of the next channel being output prior to the arrival of the edge of the LRCK signal that initiates the output of that next channel. Consequently, transitions in the SDOUT output stream are independent of the edges of the LRCK signal.

Advantageously, the problem of noise correlated to the edges of the LRCK signal is minimized, such that noise management efforts may be focused on retiming the SCLK signal with the MCLK signal. Specifically, the first bit of the next channel may be transmitted in response to the SCLK signal after the edge of MCLK signal which controls the sampling of the analog inputs AlNi+ and AlNi− of FIG. 1.

FIG. 3 is a timing diagram illustrating the transmission of serial data through serial audio port 109 according to the principles of the present invention. While FIG. 3 illustrates a representative audio embodiment, such principles are equally applicable to any one of a number of different applications in which multiple channels of serial data are multiplexed into a single data stream.

In illustrative embodiment of FIG. 3, left- and right-channel data are being transferred in 32-slot frames, with each frame defined between sequential rising and falling edges of the LRCK signal and each slot defined between falling edges of the SCLK clock signal. For discussion purposes, each frame includes a twenty four (24) bit sample of left-justified audio data B0–B23, four (4) additional slots S2–S7, and two (2) preemption slots, which are discussed further below. (In conventional serial port systems, the two preemptions slots and additional slots 52–57 are padded with logic zero (0) values.)

In FIG. 3, bit B23 is the most significant bit (MSB) of each data sample and bit B0 is the least significant bit (LSB). In accordance to the left-justified audio interface standard, left channel audio data are transmitted during frames defined by the logic high cycles of the LRCK signal and right channel audio data are transmitted during frames defined by logic low cycles of the LRCK signal. In the I²S format, left channel audio data are transmitted during the frames corresponding to the logic low cycles of the LRCK signal and right channel audio data during the frames defined by the corresponding logic high cycles. According to the principles of the present invention, the MSB of each frame is switched to the SDATA output during the preemption slots of the previous frames.

In the embodiment of FIG. 3, each MSB of a given frame extends into the previous frame by two (2) preemption slots, corresponding to two (2) periods of the SCLK signal. The MSB is then held at the SDOUT output through the first slot of the current frame. In other words, each MSB transmitted on the SDOUT output is three (3) SCLK clock signal periods in length, with two (2) SCLK clock signal periods disposed within the previous frame and one (1) SCLK clock signal period within the current frame. In alternate embodiments, the number of preemption slots may vary from one (1) or more, depending on the number of additional slots available in each frame that are not dedicated to carrying data bits.

In the illustrated embodiment of serial port 109 of FIG. 2, the timing shown in FIG. 3 is implemented by port control circuitry 205, although other techniques may be utilized in alternate embodiments. Port control circuitry 205 counts periods of the SCLK signal occurring between edges of the LRCK signal. Since the number of SCLK signal periods between LRCK signal edges is fixed, the falling edge of the SCLK signal on which multiplexer 201 must switch the SDATA output to provide the desired number of preemption bits is known. Once this falling edge of the SCLK signal is reached, port control circuitry 205 disables the shift register 202a or 202b that is presently shifting out data with the ENABLE signal and switches the output of multiplexer 201 to the output of the shift register 202a or 202b, which will be shifting out the next frame of data. Shifting by the new shift register 202a or 202b is disabled such that the MSB of the new frame is held at the SDOUT output during the preemption slots. With the arrival of the next edge of the LRCK signal, port control circuitry 205 enables the new shift register 202a or 202b, and data is shifted through the SDATA output in response to the SCLK signal. At the same time, port control circuitry 205 resets and begins counting SCLK signal periods for the new frame.

Advantageously, the MSB of each frame is already available at the serial output SDOUT when the LRCK signal transitions. Consequently, the transition of data at the SDOUT output is independent of the transition of the LRCK signal. Instead, the MSB of each frame is clocked through the SDOUT output by the SCLK clock signal, which is retimed with respects to the MCLK signal. Since the MCLK signal times the sampling of the analog input signals, transitions of the SCLK clock signal are timed to avoid transitions during analog sampling, and other noise sensitive events.

Additionally, by providing the MSB of each frame prior to the corresponding transition of the LRCK signal, the period of valid MSB data between the LRCK signal transition and the following falling edge of the SCLK clock signal, which transitions the SDOUT output to the next significant bit, is maximized. As a result, a receiving device or system has more time available to capture each MSB in the SDOUT data stream after the corresponding transition of the LRCK signal.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A method of transmitting data with a serial port comprising:
    transmitting data as an output stream of frames defined by edges of a frame clock signal, a first data bit of a current frame transmitted during a time period starting in a preceding frame and extending after an edge of the frame clock signal defining the start of the current frame.

2. The method of claim 1, wherein bits of data are transmitted in response to a bit clock signal and the time period begins at least one period of the bit clock signal occurring before the edge of the frame clock signal.

3. The method of claim 1, wherein the time period extends one period of the bit clock period after the edge of the frame clock signal defining the start of the current frame.

4. The method of claim 1, wherein the previous data frame includes time slots carrying data and preemption time slots, the time period includes at least one of the preemption time slots of the previous data frame.

5. The method of claim 1, wherein bits of data are transmitted in response to edges of a clock signal and the time period begins a selected number of edges of the clock signal before the edge of the frame clock signal defining the start of the current frame and the time period ends one edge of the clock signal after the frame clock edge defining the start of the current frame.

6. The method of claim 1, wherein the frame clock signal comprises an audio left-right clock signal multiplexing left- and right-channel audio data into the output stream.

7. The method of claim 2, wherein the bit clock comprises an audio serial clock signal clocking the transmission of audio data bits in the output stream.

8. The method of claim 1, wherein the first bit of the current frame is the most significant bit of the current frame.

9. Serial output control circuitry comprising:
    an output terminal; and
    switching circuitry operable to transmit data from the output terminal as an output stream of frames defined by edges of a frame clock signal, a first data bit of a current frame transmitted during a time period starting in a preceding frame and extending after an edge of the frame clock signal defining the start of the current frame.

10. The serial output control circuitry of claim 9, wherein the switching circuitry comprises:
    a first shift register for shifting out the preceding frame in response to a bit clock;
    a second shift register for shifting out the current frame in response to the bit clock; and
    switching circuitry for switching between an output of the first shift register and an output of the second shift register a selected number of periods of the bit clock prior to the edge of the frame clock signal.

11. The serial output control circuitry of claim 10, wherein the switching circuitry disables shifting of the second shift register prior to the edge of the frame clock signal.

12. The serial output control circuitry of claim 10, wherein the switching circuitry counts periods of the bit clock between edges of the frame clock and in response switches between the output of the first shift register and the output of the second shift register.

13. The serial output control circuitry of claim 9, wherein the data are audio serial data and the frame clock controls transmission of time-multiplexed channels of the audio serial data.

14. The serial output control circuitry of claim 9, wherein the first bit of the current frame is the most significant bit of the current frame.

15. An audio circuit comprising:
    an audio serial port for exchanging serial audio data in response to a frame clock and a bit clock; and
    serial port control circuitry for controlling the exchange of audio data frames through the audio serial port such that a first bit of a current audio data frame is available at the serial port at least one period of the bit clock signal before the edge of the frame clock signal indicating the start of the current audio data frame.

16. The audio circuit of claim 15 further comprising a data converter for converting the frames of audio data exchanged through the serial port from one format to another format.

17. The audio circuit of claim 15, wherein the audio serial port comprises an audio serial output port.

18. The audio circuit of claim 15, wherein the frame clock comprises a left-right clock controlling the exchange of left and right channels of time-multiplexed audio data in a single data stream.

19. The audio circuit of claim 16, wherein the data converter comprises an analog to digital converter.

20. The audio circuit of claim 15, wherein the first bit is a most significant bit of the current audio data frame.

* * * * *